(12) United States Patent
Li et al.

(10) Patent No.: US 10,388,743 B2
(45) Date of Patent: Aug. 20, 2019

(54) POWER ELECTRONIC AND OPTOELECTRONIC DEVICES WITH INTERDIGITATED ELECTRODES

(71) Applicants: Zhanming Li, West Vancouver (CA); Yue Fu, Coquitlam (CA); Wai Tung Ng, Thornhill (CA); Yan-Fei Liu, Kingston (CA)

(72) Inventors: Zhanming Li, West Vancouver (CA); Yue Fu, Coquitlam (CA); Wai Tung Ng, Thornhill (CA); Yan-Fei Liu, Kingston (CA)

(*) Notice: Subject to any disclaimer, the term of this patent is extended or adjusted under 35 U.S.C. 154(b) by 0 days.

(21) Appl. No.: 15/783,888

(22) Filed: Oct. 13, 2017

(65) Prior Publication Data

US 2018/0108743 A1 Apr. 19, 2018

Related U.S. Application Data

(60) Provisional application No. 62/409,188, filed on Oct. 17, 2016.

(51) Int. Cl.
| | | |
|---|---|---|
| *H01L 29/417* | (2006.01) |
| *H01L 29/40* | (2006.01) |
| *H01L 29/778* | (2006.01) |
| *H01L 31/0224* | (2006.01) |
| *H01L 33/38* | (2010.01) |
| *H01L 31/108* | (2006.01) |
| *H01L 33/20* | (2010.01) |

(52) U.S. Cl.
CPC ...... *H01L 29/41758* (2013.01); *H01L 29/401* (2013.01); *H01L 29/7786* (2013.01); *H01L 31/022408* (2013.01); *H01L 31/1085* (2013.01); *H01L 33/38* (2013.01); *H01L 33/20* (2013.01)

(58) Field of Classification Search
USPC ........................................................ 257/401
See application file for complete search history.

(56) References Cited

U.S. PATENT DOCUMENTS

2016/0079444 A1* 3/2016 Wright ................... H01L 29/93
257/599
2017/0104064 A1* 4/2017 Aoki ................... H01L 29/7786

* cited by examiner

*Primary Examiner* — Zandra V Smith
*Assistant Examiner* — Lawrence C Tynes, Jr.

(57) ABSTRACT

This invention relates to interdigitated electrodes for power electronic and optoelectronic devices where field and current distribution determine the device performance. Described are geometries based on rounded asymmetrical fingers and electrode bases of varying width. Simulations demonstrate benefits for reducing self-heating and thermal power loss, which reduces overall on-state resistance and increases reverse break down voltages.

24 Claims, 14 Drawing Sheets

GR=0.8, RR=0.0001

GR=1.0, RR=0.0001

POWER ELECTRONIC AND OPTOELECTRONIC DEVICES WITH INTERDIGITATED ELECTRODES

RELATED APPLICATION

This application claims the benefit of the filing date of Application No. 62/409,488, filed Oct. 17, 2016, the contents of which are incorporated herein by reference in their entirety.

FIELD

This invention relates to interdigitated electrodes for a class of semiconductor devices where high power, uniform electric field and/or high voltage operations are critical. Such devices include power GaN HEMT, high speed metal-semiconductor-metal (MSM) photodetectors, and high power LEDs.

BACKGROUND

Novel device technologies, such as those using third generation semiconductor materials (e.g., GaN) to construct high electron mobility transistors (HEMT) dramatically improve both switching and conduction efficiency, due to the wide bandgap property of these new materials and corresponding two-dimensional electron gas (2DEG) from the heterostructure formed by AlGaN and GaN layers. These devices are typically lateral devices, which means that current is flowing close to the surface.

Many power electronics applications typically require semiconductor devices capable of carrying current in the range of 1 A to 100 A. In lateral power devices such as GaN HEMT, current rating depends on the width of the current flowing path (from drain to source or vice versa) that translates into a very narrow strip structure, which is impractical according to today's semiconductor manufacturing and assembly standard. Interdigitated electrodes have been designed to improve the current carrying capability.

Interdigitated electrodes for semiconductor electronic and optoelectronic devices have the advantage of efficient use of wafer area and low overall contact resistance. A commonly used set of interdigitated electrodes consists of rectangular intervening fingers connected to two electrode bases, such as drain 11 and source 12 in FIG. 1. All metal structures are rectangle and are easy to implement in layout and fabrication.

Interdigitated electrodes have been in common use for the cathode and anode of photodiodes (PD) and sensors [1][2][3], and for the source and drain of field effect transistors (FETs) [4][5] with the gate located between.

Layout using interdigitated electrodes is also related to packaging since the electrical wiring must be properly bonded to make contact with the bases of the electrodes. To reduce resistance, the distribution of current flow path from the wiring to the fingers must be taken into account.

For FETs, previous work [4] proposed using a rounded (semi-circle) shape for the fingertips of a rectangle [4] to reduce corner effects. The geometry of the fingers was also converted from rectangular to trapezoidal to reduce current crowding (thus heating) [5].

For PDs and sensors, previous efforts to optimize the geometry includes the following: 1) semicircular-shaped interdigitated electrodes were used to reduce capacitance and thus increase speed [1]; 2) star-shaped electrode base with curved fingers was used, for the purpose of reducing the electrode shadowing effect in order to increase photo detection sensitivity [2]; 3) symmetric cycles and polygons were used for the fingers in order to fit to the circular acoustic device of interest and for ease of processing [3].

Previous work [5] described the use of a trapezoidal finger shape which resulted in improved current flow distribution and reduced resistance. However, there are limitations related to high fields at corners and inability to spread the high fields to other parts of the fingers.

In addition, existing layout designs potentially have high device on-state resistance and/or low break down voltage due to non-uniformity in current flow or field distribution.

SUMMARY

Provided herein are interdigitated electrode for electronic semiconductor devices. The interdigitated electrodes have geometries that improve device performance by delivering current or power uniformly over the whole device surface, including both the semiconductor and metal electrodes, while maximizing the chip usage per unit area. A feature of the embodiments is field distribution control, which reduces the likelihood of breakdown (e.g., reverse breakdown) of a device, increasing its power handling and reliability.

According to a first aspect of the invention, the fingers of interdigitated electrodes are of an asymmetric shape with rounded finger tips. The asymmetric shape is such as to extend from an electrode base of varying width. In various embodiments, rounded finger tips can be characterized by one of the following three shapes: 1) circular; 2) oval-shaped; 3) whole finger shape defined by a single power function with a power no less than two; however, other rounded shapes may be used.

According to a second aspect of the invention, an interdigitated electrode has an electrode base with varying base width. Methods for implementing such electrode bases are described, and include a flow ratio method and a constant angle method. The flow ratio method regulates the base width such that a fixed percentage of the current flow in proportion to finger width is delivered to a specific finger. Such a method has stronger control of the flow distribution over the metal electrode area, while geometric layout size control may be challenging. The constant angle method forces the base to have a straight base line at a selected angle, and, therefore, the chip dimension can be more easily controlled in device layout. The latter method provides less control over current flow uniformity to all the fingers.

In one embodiment, a semiconductor device comprises a semiconductor conductive area between two electrodes of interdigitated pattern, with asymmetric shaped finger having a fingertip of circular geometry.

In one embodiment, a semiconductor device comprises a semiconductor conductive area between two electrodes of interdigitated pattern, with asymmetric shaped finger having a fingertip of oval geometry.

In one embodiment, a semiconductor device comprises a semiconductor conductive area between two electrodes of interdigitated pattern, with asymmetric shaped finger having a geometry defined by a power function, wherein the power is two or greater.

In one embodiment, a semiconductor device comprises a semiconductor conductive area between two electrodes of interdigitated pattern, with base electrodes of variable width.

The embodiments may further comprise a control electrode coupled to the conductive channel and operable to interrupt or complete the conductive channel.

The embodiments may further comprise base electrodes of variable width defined by a flow ratio (GR) between remaining flow over flow to a next finger.

The embodiments may further comprise base electrodes of variable width defined by a constant angle forming a right-angle triangle for the base.

The embodiments may further comprise a bounding box of right-angle triangle with electrodes at two or three corners.

According to a third aspect of the invention, a semiconductor device comprises at least two electrodes, each electrode comprising an electrode base with varying width and a plurality of asymmetrical fingers extending therefrom, wherein the asymmetrical fingers of the at least two electrodes are interdigitated; and a semiconductor channel between the interdigitated fingers of the electrodes; wherein each asymmetrical finger has a smooth shape without angular corners.

In one embodiment, a finger tip of each asymmetrical finger has a circular shape.

In one embodiment, a finger tip of each asymmetrical finger has an oval shape.

In one embodiment, a finger tip of each asymmetrical finger has a shape defined by a power function, wherein the power is two or greater than two.

In one embodiment, a width of the electrode base varies across the plurality of asymmetrical fingers extending therefrom, such that the width of the electrode base at each asymmetrical finger is different.

In one embodiment, the width of the electrode base varies linearly according to a selected angle.

In one embodiment, the width of the electrode base varies non-linearly according to a mathematical function.

In one embodiment, the width of the electrode base varies according to a flow ratio (GR) between remaining current flow and current flow to a next finger.

In one embodiment, the electrode base with varying width provides current density uniformity across the plurality of asymmetrical fingers.

In one embodiment, a shape of the electrode base is substantially a right-angle triangle.

In one embodiment, the electrode base comprises a bounding box of right-angle triangle with electrodes at two or three corners.

In the embodiments, the semiconductor device may further comprise control electrode coupled to the semiconductor channel between the interdigitated asymmetrical fingers of the electrodes; wherein the control electrode is operable to interrupt or complete the semiconductor channel.

According to a fourth aspect of the invention, a method for implementing a semiconductor device comprises providing each of at least two electrodes of the semiconductor device with an electrode base with varying width and a plurality of asymmetrical fingers extending therefrom, wherein the asymmetrical fingers of the at least two electrodes are interdigitated; and providing a semiconductor channel between the interdigitated fingers of the electrodes; wherein each asymmetrical finger has a smooth shape without angular corners.

In one embodiment the method comprises implementing a finger tip of each asymmetrical finger with a circular shape.

In one embodiment the method comprises implementing a finger tip of each asymmetrical finger with an oval shape.

In one embodiment the method comprises implementing a finger tip of each asymmetrical finger with a shape defined by a power function, wherein the power is two or greater than two.

In one embodiment the method comprises varying a width of the electrode base across the plurality of asymmetrical fingers extending therefrom, such that the width of the electrode base at each asymmetrical finger is different.

In one embodiment the method comprises varying the width of the electrode base linearly according to a selected angle.

In one embodiment the method comprises varying the width of the electrode base non-linearly according to a mathematical function.

In one embodiment the method comprises varying the width of the electrode base according to a flow ratio (GR) between remaining current flow and current flow to a next asymmetrical finger.

In one embodiment the method comprises varying the electrode base so as to provide current density uniformity across the plurality of asymmetrical fingers.

In the embodiments the method may comprise coupling a control electrode to the semiconductor channel between the interdigitated asymmetrical fingers of the electrodes; wherein the control electrode is operable to interrupt or complete the semiconductor channel.

BRIEF DESCRIPTION OF THE DRAWINGS

To better understand the invention, and to show more clearly how it may be carried into effect, embodiments will be described, by way of example, with reference to the accompanying drawings, wherein:

FIGS. 3A, 36 and 3C are schematic diagrams of three tip shapes of asymmetric fingers according to three embodiments of the invention: asymmetric circular, asymmetric oval-shaped, and power function, respectively.

DETAILED DESCRIPTION OF EMBODIMENTS

Figure 1:
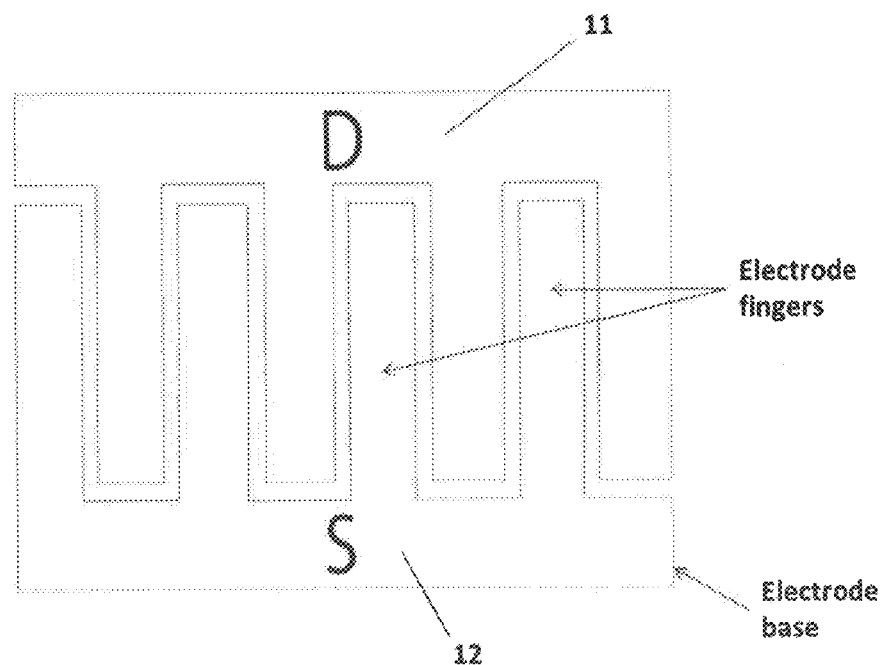
FIG. 1 is a schematic diagram showing the rectangular shapes of metal electrodes and interdigitated fingers that are currently used in interdigitated electrode design, according to the prior art.

Described herein are interdigitated electrode geometries for electronic devices. The interdigitated electrodes deliver current or power uniformly over the whole device surface, including both the semiconductor and metal electrode, while maximizing the substrate usage per unit area. A feature of the interdigitated electrode geometries is field distribution control, which is related to breakdown of the devices. For example, asymmetric fingers of the interdigitated electrodes may be designed according to a mathematical equation or function (e.g., a power function) that results in a smooth shape of the fingers, which is effective in spreading the electrical field and reducing or eliminating the possibility of breakdown of a device. The term "smooth shape", as used herein, refers to a shape that lacks angular corners (i.e., vertices). This is a significant advantage over prior devices such as that shown in FIG. 1, wherein the fingers of the interdigitated electrodes have angular corners that concentrate the electric field and may increase the likelihood of breakdown of the device.

Another feature of the interdigitated electrodes described herein is that the electrode fingers corresponding to each terminal of a device extend from an electrode base having a width that varies along its length. As described in detail below, in some embodiments the variation in the width of the base may be selected according to a fixed angle (θ) such that the width of the base has a linear taper (i.e., the width of the base varies linearly). In other embodiments the variation in the width of the base may be selected according to a mathematical function such that the width of the base has a non-linear taper (i.e., the width of the base varies non-linearly). In either case, the electrode fingers extend from the electrode base along a virtual straight or curved line defined by the taper, such that each finger is asymmetrical (i.e., one side of a finger is longer than the other side).

Interdigitated electrode geometries as described herein may be used for semiconductor devices where high power, uniform electric field, and/or high voltage operation are critical. Such devices include, but are not limited to, power GaN HEMT, high speed MSM photodetectors, and high power LEDs.

Also described herein are methods for implementing interdigitated electrode geometries in electronic devices including, but not limited to, power GaN HEMT, high speed MSM photodetectors, and high power LEDs.

Various examples of interdigitated electrode geometries are described below. However, it will be appreciated that the invention is not limited thereto as the geometries may be altered, modified, adapted, etc., to suit specific types of devices and applications, and power requirements or ratings.

A. Asymmetric Fingers with Circular and Oval-Shaped Tips

Figure 2:
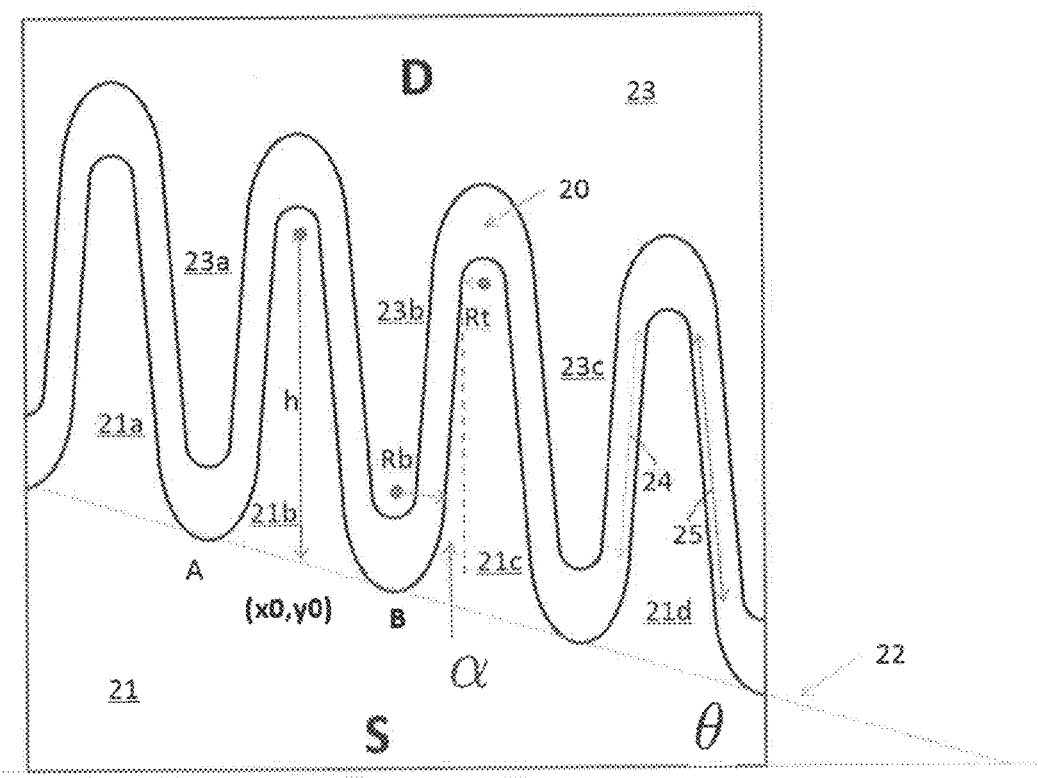
FIG. 2 is a schematic diagram showing an asymmetric shape of metal electrodes and asymmetric interdigitated fingers, according to one embodiment.

The embodiment of FIG. 2 shows interdigitated electrodes for the drain D and source S of a field-effect transistor (FET) device. A space or channel between source and drain electrode fingers includes a semiconductor conductive area comprising a semiconductor material. Some devices, such as a FET, may have a control electrode coupled to the conductive channel, which is operable to interrupt or complete the conductive channel. In the figure, four fingers are shown for the source electrode and three fingers are shown for the drain electrode. However, any number of fingers may be used for the source and drain electrodes. The electrodes are typically made of a metal (such as gold) or a metal alloy.

The source electrode includes an electrode base 21 and fingers 21a-21d. The drain electrode includes an electrode base 23 and fingers 23a-23c. A space 20 between source and drain electrode fingers includes a semiconductor conductive area comprising a semiconductor material (such as GaN). In FIG. 2 a line 22 is drawn on the source electrode base at an angle θ. Thus, in this embodiment, the virtual line 22 defines a linear taper, at an angle θ, of the source electrode base 21. The drain electrode base 23 may be tapered at the same angle. In some embodiments the drain electrode may be tapered at a different angle than the source electrode. The source electrode fingers 21a-21d extend from the source electrode base along the virtual line 22, resulting in the fingers having an asymmetrical profile. The drain electrode fingers are arranged the same way. In other embodiments, the line 22 may have a selected curvature, which may be defined by a mathematical function such as a power function, so as to define a non-linear taper of the electrode base.

As shown in FIG. 2, the length of each finger from its midpoint along the line 22 (e.g., between points A and B for finger 21b) to its tip center is defined as h. In some embodiments, the finger length may vary across the electrode. Each finger has a taper angle denoted as α. The valley between adjacent fingers, also referred to herein as the "bottom", has a smooth shape that is generally rounded, and may be, for example, circular, oval, or other smooth, curved shape. The tip of each finger has a smooth shape that is generally rounded, and may be, for example, circular, oval, or other smooth, curved shape. For the embodiment of FIG. 2, wherein a linear base angle θ is used, a base electrode may be described as a polygon, where the polygon is defined by the outer boundaries of the electrode base and the line 22.

The realization of finger shape in layout and fabrication may be achieved using the mathematical formulas below. For example, without loss of generality of using either circle or oval shapes for the finger bottoms and tips, consider a case where the tip of a finger in FIG. 2 is circular having radius Rt and the bottom of a finger is of oval-shape with a ratio of the longer radius in the y-direction over the shorter radius Rb in the x-direction of $r_{yx}$. The finger shape may be realized by using the following formulas for the length of the finger left edge ($L_l$) (represented by the arrow 24 in FIG. 2):

$$L_l = \frac{h - R_b r_{yx} + (R_t + R_{bp})\sin(\alpha) - (R_t + R_{bp})\cos(\alpha)\tan(\theta)}{\cos(\alpha) + \sin(\alpha)\tan(\theta)} \quad (1)$$

Similarly, the length of the finger right edge ($L_r$) (represented by the arrow 25 in FIG. 2) can be found by:

$$L_r = \frac{h - R_b r_{yx} + (R_t + R_{bp})\sin(\alpha) + (R_t + R_{bp})\cos(\alpha)\tan(\theta)}{\cos(\alpha) - \sin(\alpha)\tan(\theta)} \quad (2)$$

where $$R_{bp} = \sqrt{[R_b\cos(\alpha)]^2 + [R_b r_{yx}\sin(\alpha)]^2} \quad (3)$$

is the oval radius at a finger bottom.

Figure 3A:
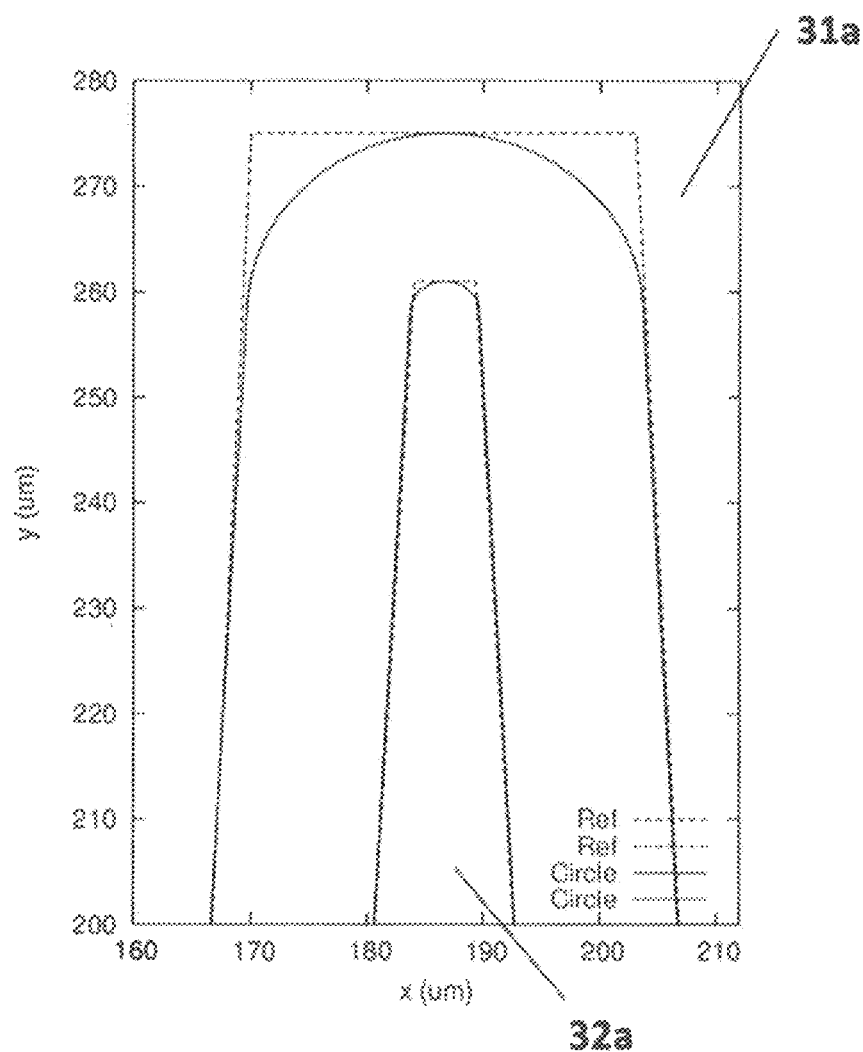
Figure 3B:
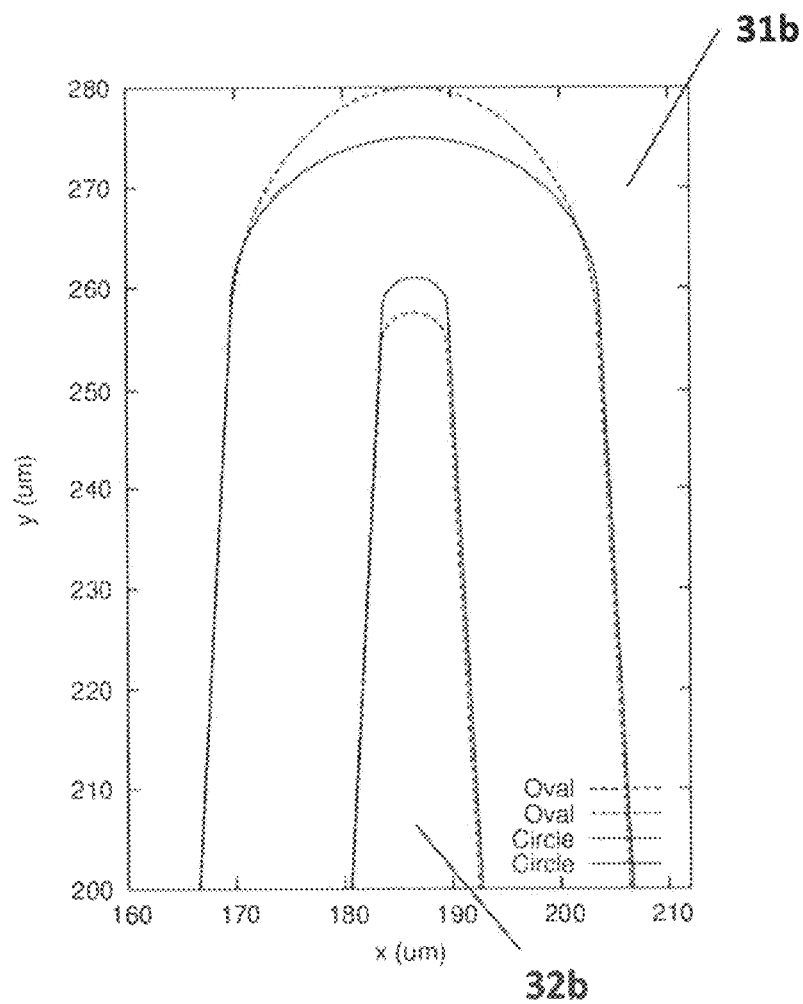

Using these formulas, circle and oval shaped finger tips such as those illustrated in FIGS. 3A and 3B, respectively, with drain electrode base 31a and 31b, respectively and source electrode finger 32a and 32b, respectively, may be obtained. FIG. 3A also compares the circular tip area and circular base area with a trapezoid shaped finger (dashed ones, Ref) as described in [5].

B. Finger Shape with Power Function

Figure 3C:
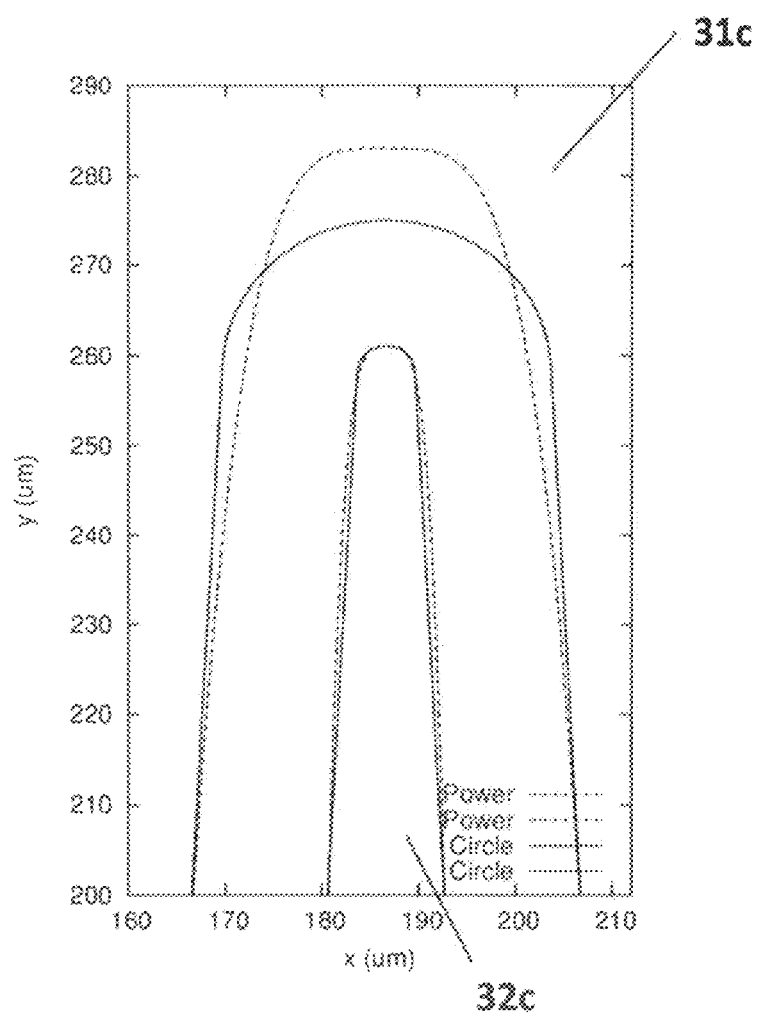

A power function may, be used to define the shape of the tip of a finger. For example, a power function may be formulated as:

$$y - y_h = -\left(\frac{W_h}{H_h^\gamma}\right)|x - x_0|^\gamma + H_h \quad (4)$$

where $y_h$ is the y-coordinate of at half the finger height, $W_h$ is the half-width of the finger at $y_h$, $H_h$ is the half finger height, and $\gamma$ is the exponent of the power function. It is found that using a $\gamma$ value of two or higher results in a smooth shape that is very effective in spreading the high intensity electric field responsible for breakdown of the device under consideration. For demonstration purposes, $\gamma=5$ was used for the finger tip of the embodiment shown in FIG. 3C. Theoretically there is no upper limit to $\gamma$, and higher values, for example, 10, 20, 50, or 100 may be used. However, values above 20 are not expected to produce significantly better performance.

C. Advantages

For demonstration purposes numerical simulations were performed using APSYS™ (Crosslight Software Inc., Vancouver, BC, Canada) by setting the semiconductor to be three orders of magnitude higher in resistivity than the metal electrode. In one simulation, a GaN HEMT device was simulated with the source and drain as interdigitated electrodes and the gate having a constant gate length. For simplicity, the gate electrode was been omitted. However, this does not affect the principles and the physical trends observed. Although GaN HEMT was used for the simulation, the principles and conclusions apply to all semiconductor devices using interdigitated electrodes as described herein. Accordingly, the invention is not limited to GaN HEMT devices, as concepts and methods are applicable to other semiconductor materials (e.g., but not limited to, GaAs, InP, GaSb) and devices such as, but not limited to, FETs, high speed MSM photodetectors, and high power LEDs.

Figure 4A:
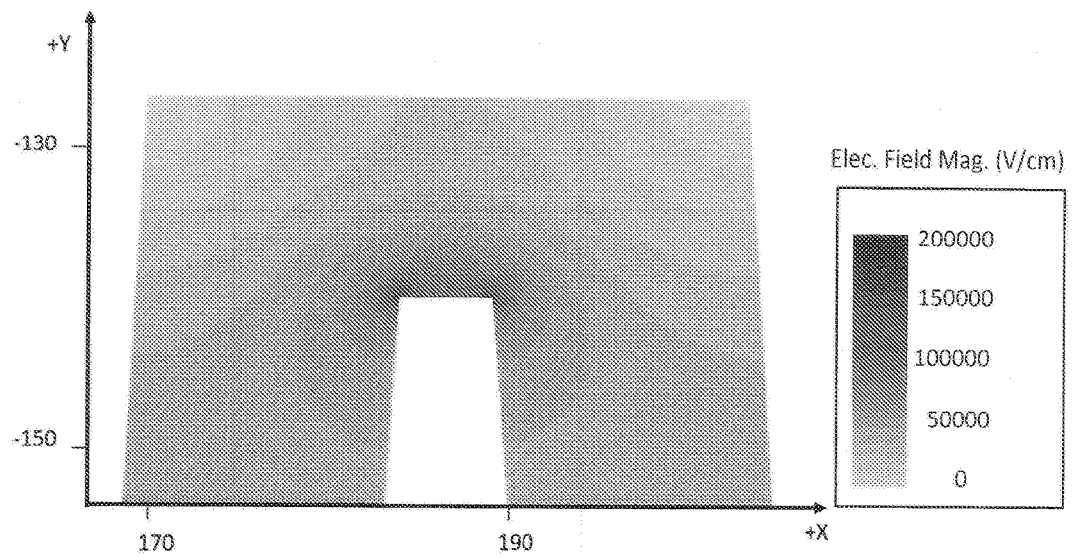
FIGS. 4A and 4B are 2D distributions of electrical fields for trapezoidal and power function finger shapes, respectively, wherein the power is five in the case of 4B.
Figure 4B:
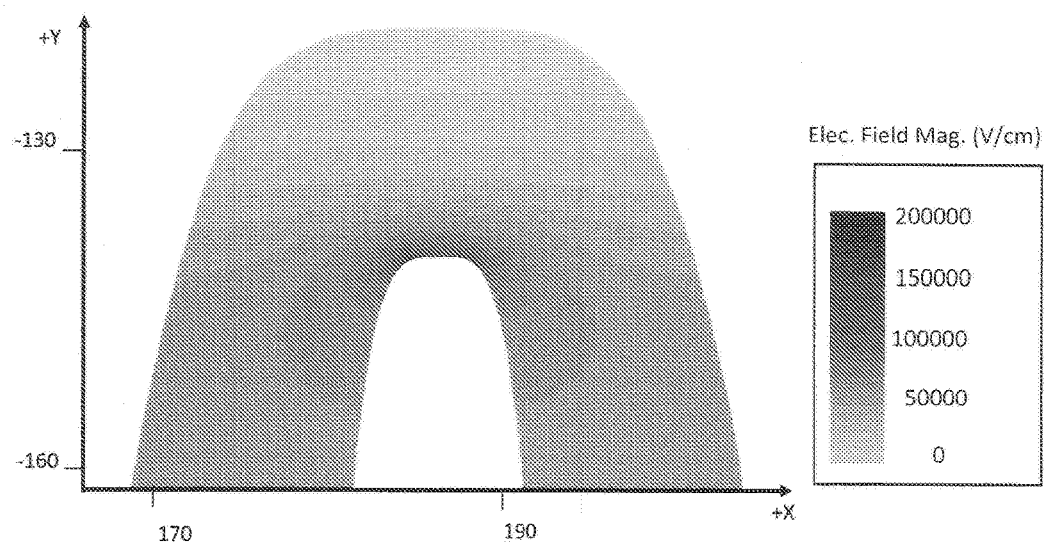

FIGS. 4A and 4B show the distribution of the electrical field in a prior art finger shape and a power function finger shape according to one embodiment where $\gamma=5$, respectively, it is clear that the power function effectively spreads the field to the whole finger instead of concentrating it near the tip, as in the prior art.

Figure 5:
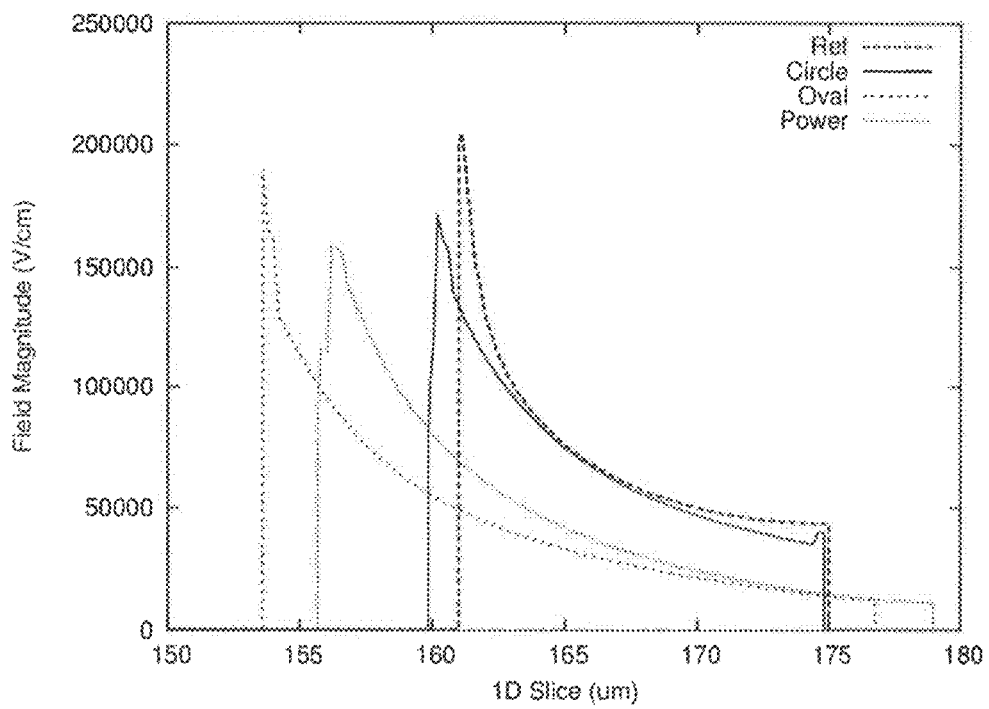
FIG. 5 is a plot comparing the electric field magnitude at a 1D slice at the corner of the fingertip, for the finger shapes of FIGS. 3A-3C.

FIG. 5 is a plot comparing the electrical field distribution in a 1D slice near the end of a finger tip where the local field is maximum, and indicates that all three finger tip shape embodiments have improved field distribution (lower and more uniform) as compared with a finger geometry with sharp corners, such as that of FIG. 4A according to the prior art.

Figure 6:
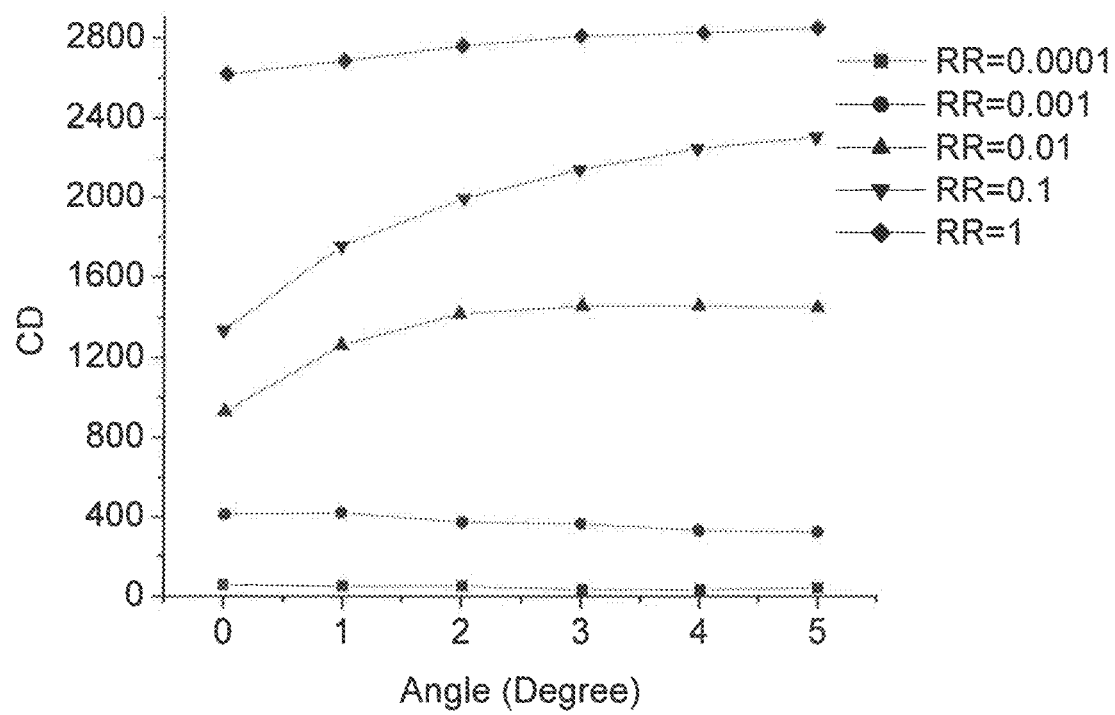
FIG. 6 is a plot showing the unit conductance (CD) as a function of taper angle for different values of resistance ratio (RR) according to the embodiment of FIG. 3A.

FIG. 6 is a unit conductance diagram showing conductance per unit device width (CD) as a function of finger taper angle $\alpha$ for interdigitated metal electrodes with different values of RR (from 0.0001 to 1) according to an embodiment of the invention with circular finger tips. RR is the resistance ratio of electrode metal over that of the semiconductor. The smaller the RR, the better the electrode conductance. As shown in FIG. 6, the unit conductance remains almost the same as the taper angle increases when RR equals or is less than 0.001; it increases as the taper angle increases when RR is larger than 0.001.

Figure 7:
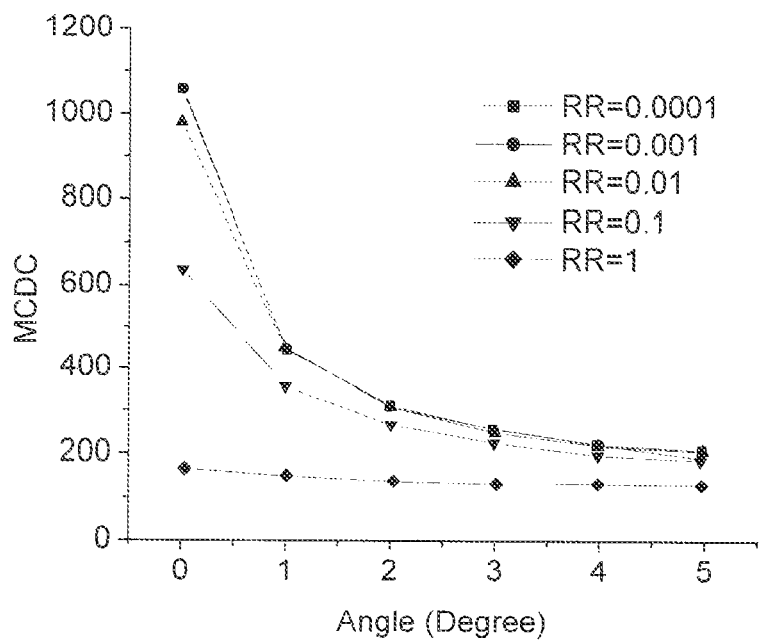
FIG. 7 is a plot showing the current crowding parameter (MCDC=maximum current density per CD) for interdigitated metal electrodes as a function of finger taper angle α for different RR values, according to an embodiment of the invention.

FIG. 7 is a plot showing the current crowding parameter MCDC (maximum current density per CD) for interdigitated metal electrodes as a function of finger taper angle $\alpha$ for different RR values, according to an embodiment wherein the device was a GaN HEMT with circular finger tips. As shown in FIG. 7, the maximum current density ($J_{max}$) decreases rapidly as the taper angle increases when RR equals or is less than 0.1, which indicates a more uniform distribution of current. It is expected that other finger shapes according to the embodiments described herein would perform similarly. Thus, current crowding may be substantially reduced or avoided by implementing an embodiment as described herein.

D. Electrode Base Design Using Flow-Ratio Method

Figure 8:
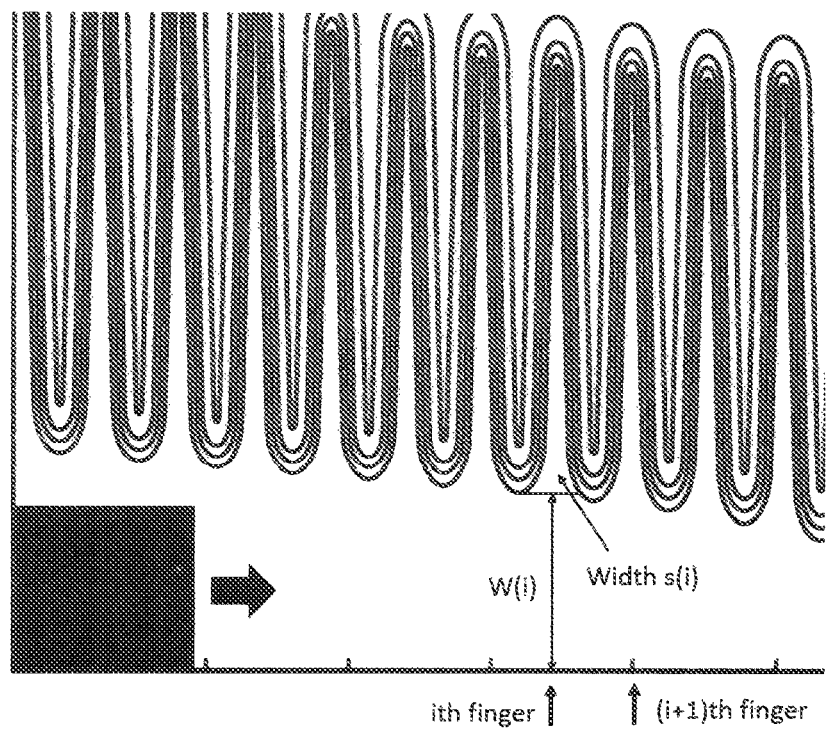
FIG. 8 is an electrode base shape analysis diagram according to an embodiment of the invention.

FIG. 8 is a base shape analysis diagram showing a photomicrograph of a portion of interdigitated electrodes according to an embodiment of the invention. As shown in FIG. 8, the direction of power flow in the metal base is indicated by the horizontal arrow. The term w(i) as used herein is intended to refer to the electrode base width which is below the $i^{th}$ finger, and the term s(i) as used herein is intended to refer to the width of the $i^{th}$ finger where it extends from the base. Similar to the term w(i), w(i+1) is used to refer to the base width below the $(i+1)^{th}$ finger. For the sake of description, a parameter referred to as geometrical ratio (GR) is defined as: SR=(w(i)−s(i))/(w(i+1)). The interpretation of GR is as follows: for some current flow along the electrode base in the direction of the horizontal arrow, at the $i^{th}$ finger, a portion of the flow will be split into finger s(i), and the remaining flow (w(i)−s(1)) will continue into the electrode base w(i+1) below the next finger. In a uniform flow, the remaining flow would fit into w(i+1) perfectly and the ratio of SR would be unity. In some designs, it may not be possible to achieve a perfect fit due to area constraints, and a smaller amount of the remaining flow continues, causing some degree of non-uniformity.

In a typical layout design, it may be challenging to control both the upper (e.g., drain) and lower (e.g., source) electrode base widths to have the same ratio (GR) while the whole device must fit into a rectangular space to maximize the wafer area usage and for ease of laser dicing. Accordingly, another aspect of this invention relates to a method for fitting a pair of n interdigitated electrodes into a rectangular chip.

For example, suppose it is desired to have N pairs of electrodes within a chip of height $H_c$. Given the finger taper angle $\alpha$, a circular finger tip radius R, the source/drain (S/D) spacing $L_{sd}$, and the desired flow ratio GR (or $G_R$), then, a set of linear equations can be set up to solve for the size of the fingers and to fit them into a rectangle, as follows:

$$H_c - 2R - 2L_{sd} = h(i) + w_b(i) + [w_t(i) + w_t(i-1)]/2 \quad (5)$$

$$w_b(i) = G_R w_b(i+1) + 2R + 2h(i)\tan(\alpha) \quad (6)$$

$$w_t(i) = G_R w_t(i-1) + 2R + 2h(i)\tan(\alpha) \quad (7)$$

where the unknowns [h(i), $w_b(i)$, $w_t(i)$] are the height of the $i^{th}$ finger, the base width below $i^{th}$ finger, and the width at the tip of $i^{th}$ finger, respectively. They form 3N sets of linear equations and can be solved using any convenient mathematical software, such as MathWorks™ (MathWorks, Inc., Natick, Mass., U.S.A.). A similar procedure may be used for embodiments with oval-shaped finger tips and finger tips defined by a power function.

Figure 9A:
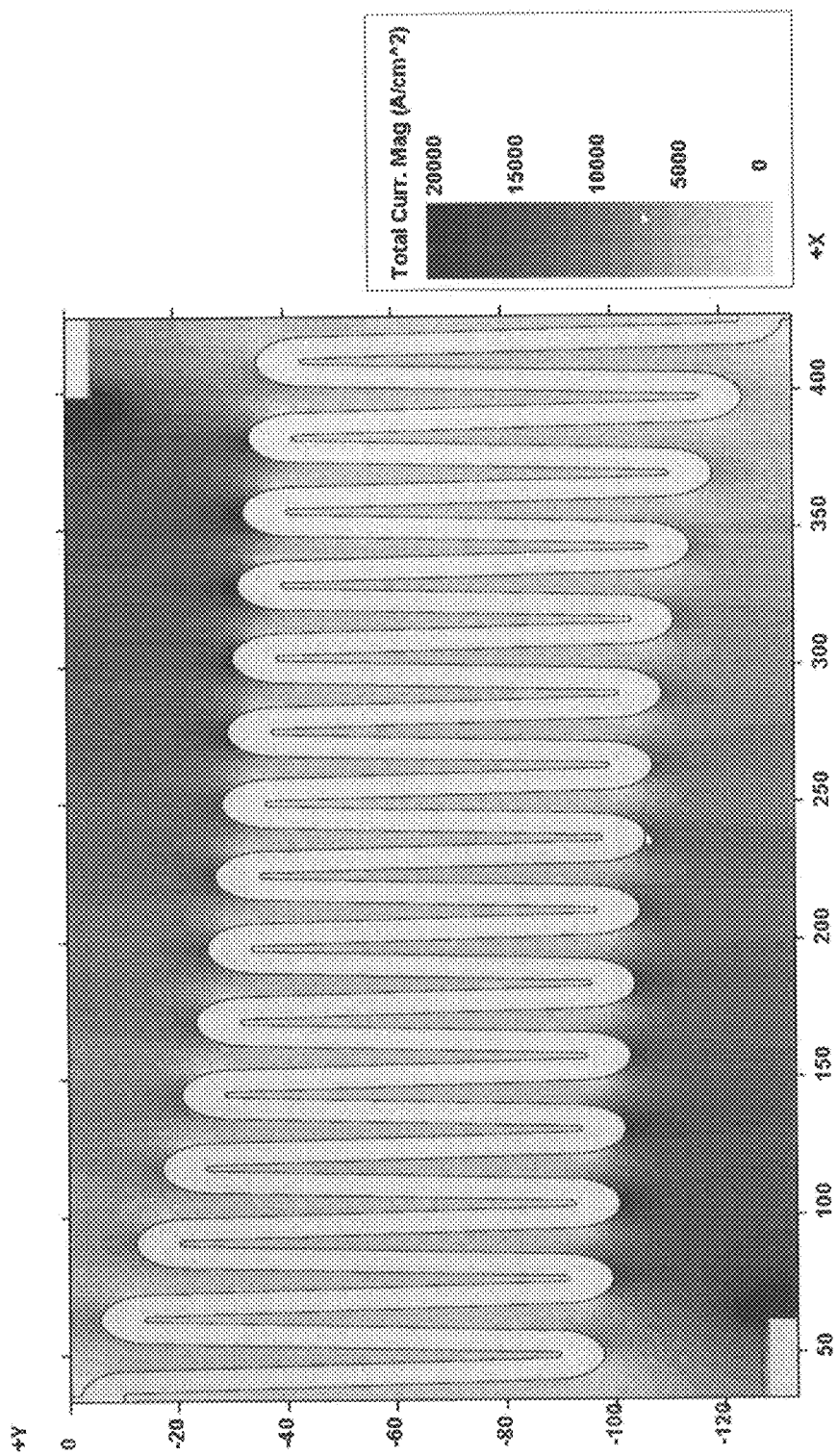
FIGS. 9A and 9B show current density distribution for two different electrode base geometry ratios, GR=0.8 and GR=1.0, respectively.
Figure 9B:
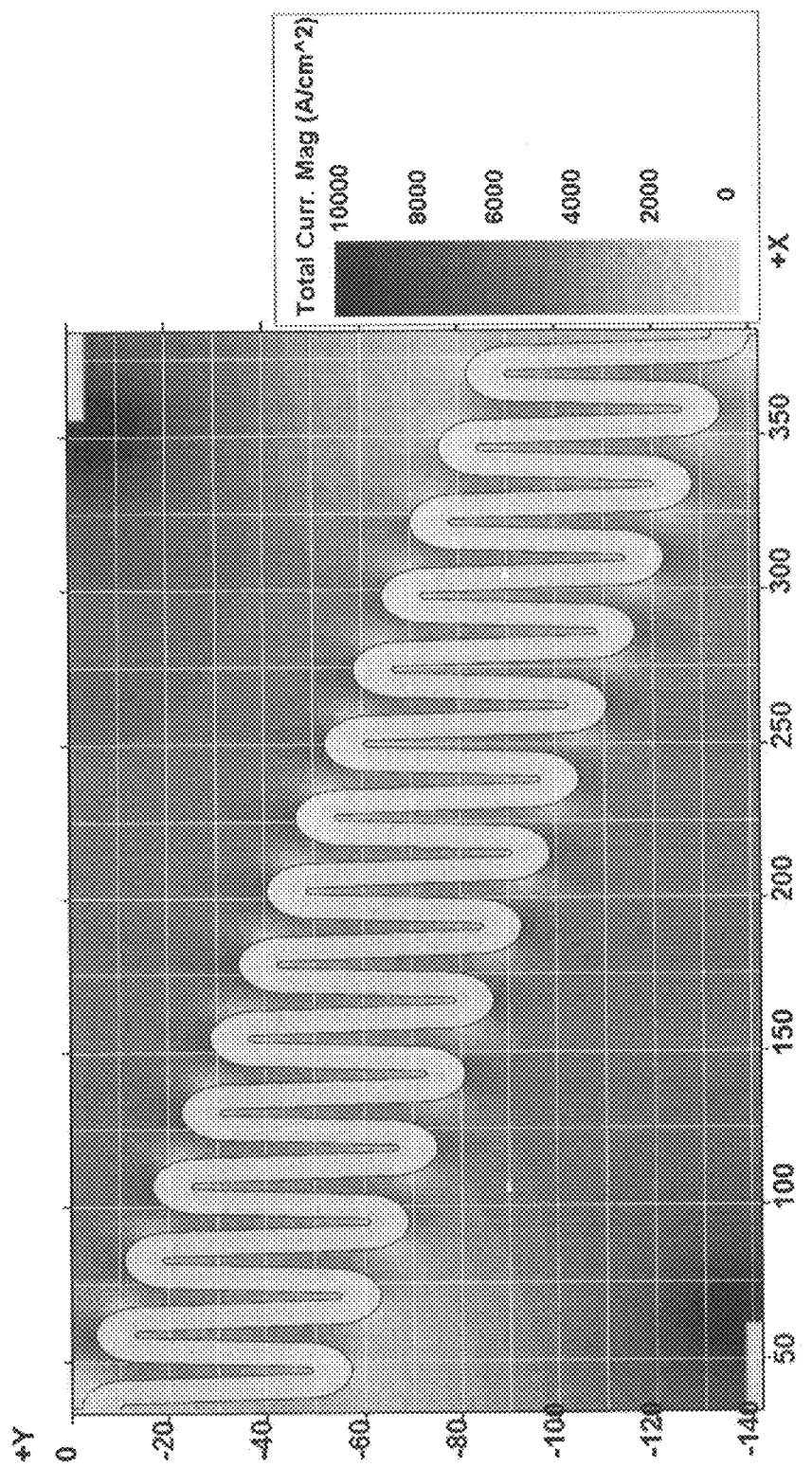

The current density distribution results of the above layout geometry are shown in FIGS. 9A and 9B for two different GR. Note that for GR=1, a perfect fit of the remaining flow into the next finger resulted in a linear base electrode (i.e., a constant base angle θ) for both the S and D (see FIG. 9B). In contrast, for GR=0.8, a perfect fit of the remaining flow into the next finger resulted in a non-linear base electrode taper for both the S and D (see FIG. 9A).

E. Electrode Base Design Using Constant-Angle Method

The design of a constant-angle base electrode is relatively simple since there is no need to solve any equations. Once a base angle θ is selected, the finger shape can be defined using methods described above using equations 1 and 2. A potential drawback is that the flow ratio can be different for each electrode pair. This can be resolved through further simulation or analysis, which is readily apparent to those of ordinary skill in the art.

However, it is clear that the constant-angle method results in a base electrode shape that is or approximates a right-angle triangle, which is relatively straight-forward to lay out.

F. Advantages of Variable Base Geometries

Based on results of the embodiments of FIGS. 9A and 96, the current density reaching the fingers is more uniform in the case of GR=1 than GR=0.8. For more quantitative analysis, the unit conductance CD and maximum current density parameter MCDC are plotted in various ways in FIGS. 10A, 10B, 11A and 11B.

Figure 10A:
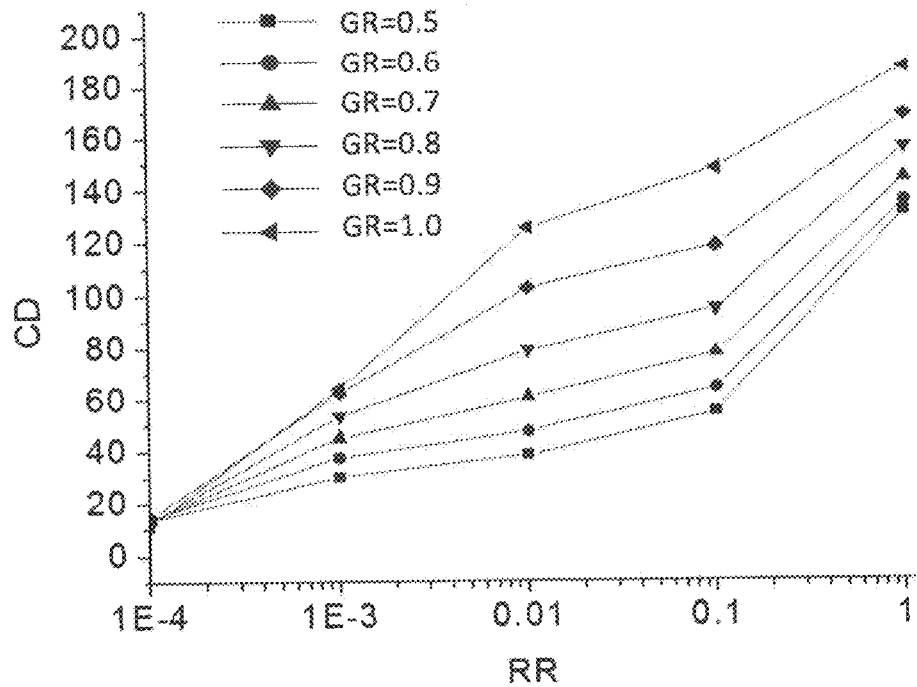
FIGS. 10A and 10B are unit conductance diagrams of a device for different geometrical ratio (GR) and RR values, according to an embodiment of the invention.

FIG. 10A shows unit conductivity with respect to RR for a range of GR values, according to an embodiment of the invention with circular finger tips. As can be seen, conductivity increases with higher RR as well as GR. Higher conductivity will ensure lower loss and better current distribution.

Figure 10B:
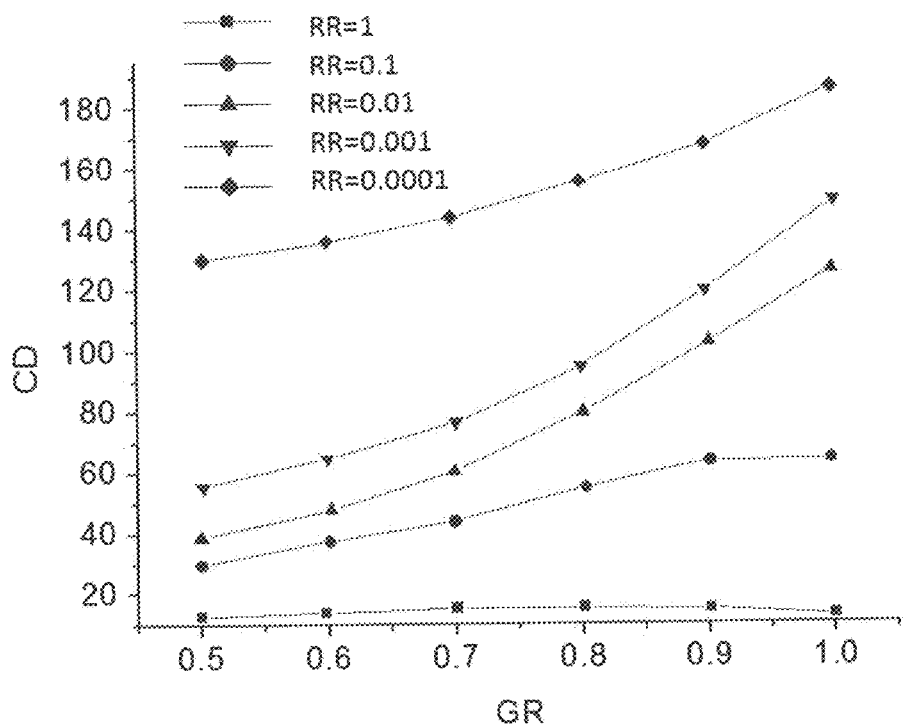

FIG. 10B shows unit conductivity vs. GR different RR values according to an embodiment of the invention with circular finger tips. Except when RR=0.0001, higher GR and RR increases conductivity.

Figure 11A:
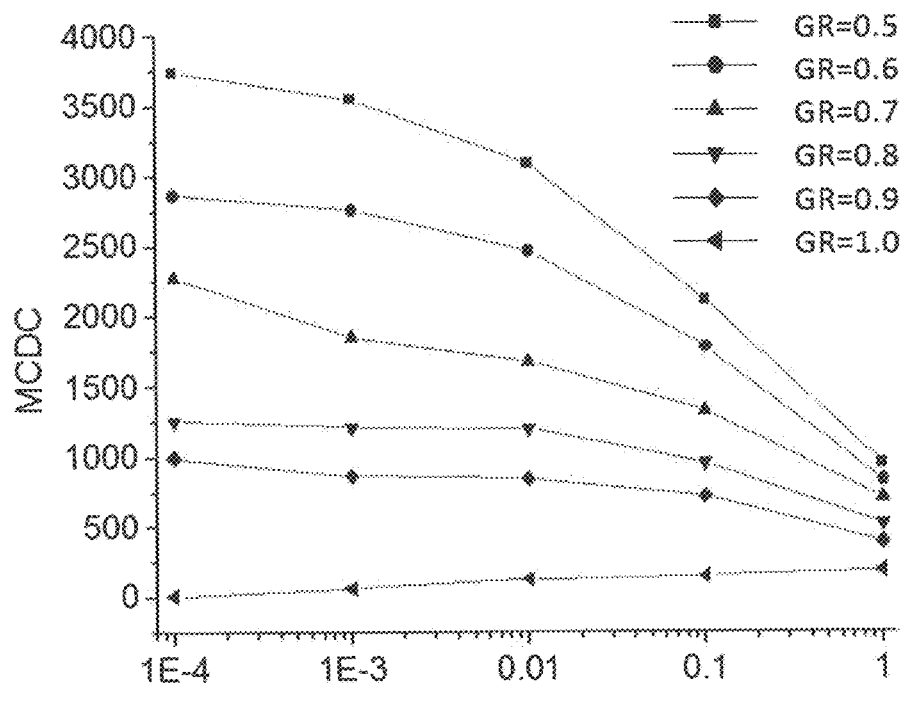
FIGS. 11A and 11B are the maximum current density of a device with different GR and RR values, according to an embodiment of the invention.
Figure 11B:
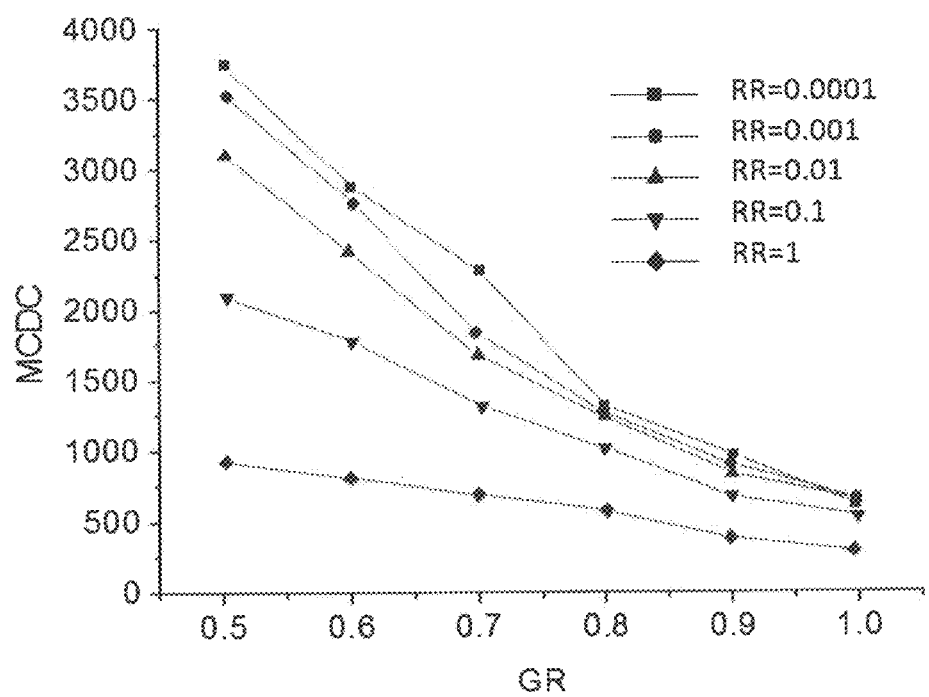

FIGS. 11A and 11B are maximum current density near semiconductor diagrams for interdigitated electrodes with different GR values or RR values, respectively, according to an embodiment of the invention similar to FIGS. 10A and 10B. As shown in FIGS. 11A and 11B, the larger GR and RR, the less current crowding and therefore less heating, which would prevent breakdown of the device.

For current crowding improvement, the improvement is 16 times (see FIG. 7) and 25 times (see FIG. 11B) better by using asymmetric fingers and an electrode base with varying width, respectively. The total improvement may be as high as 16×25 times where local heating improvement is concerned.

Figure 12:
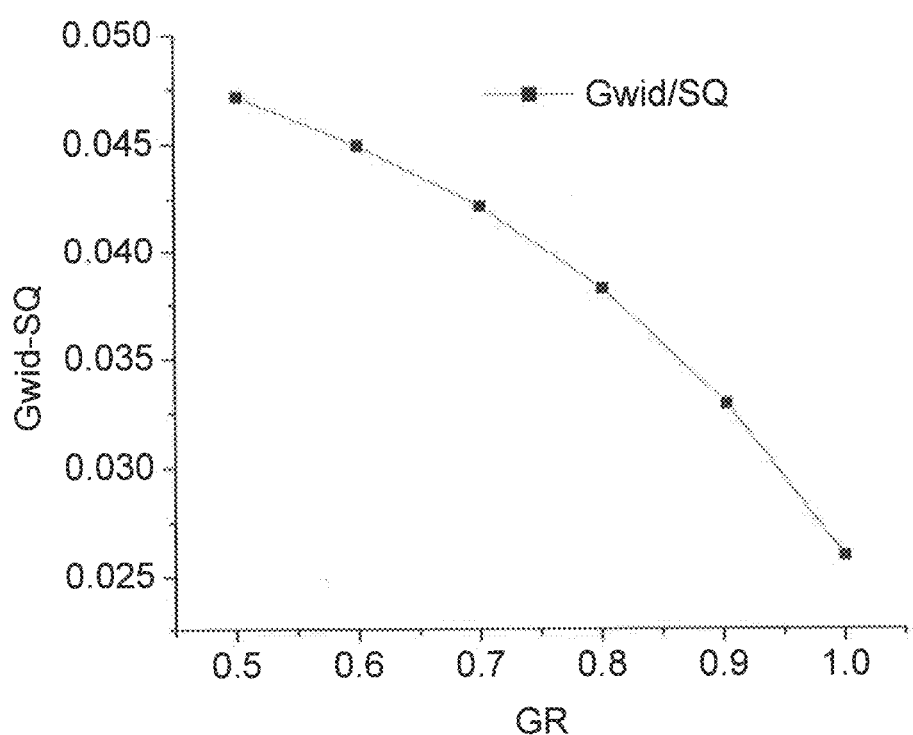
FIG. 12 is a plot showing the gate with per square wafer area (Gwid/SQ) as a function of the GR.

It should be pointed out that a large GR can certainly improve device performance by reducing device resistance and power loss (heating). However, a large GR causes waste of wafer area, and thus the cost per device increases accordingly. FIG. 12 is a plot of the total gate width per area (Gwid/SQ) of the layout as a function of GR. In actual design and fabrication, performance improvement should also be measured against increased cost according to FIG. 12.

G. As Building Block for Leaf-Shaped Layout Geometries

Figure 13:
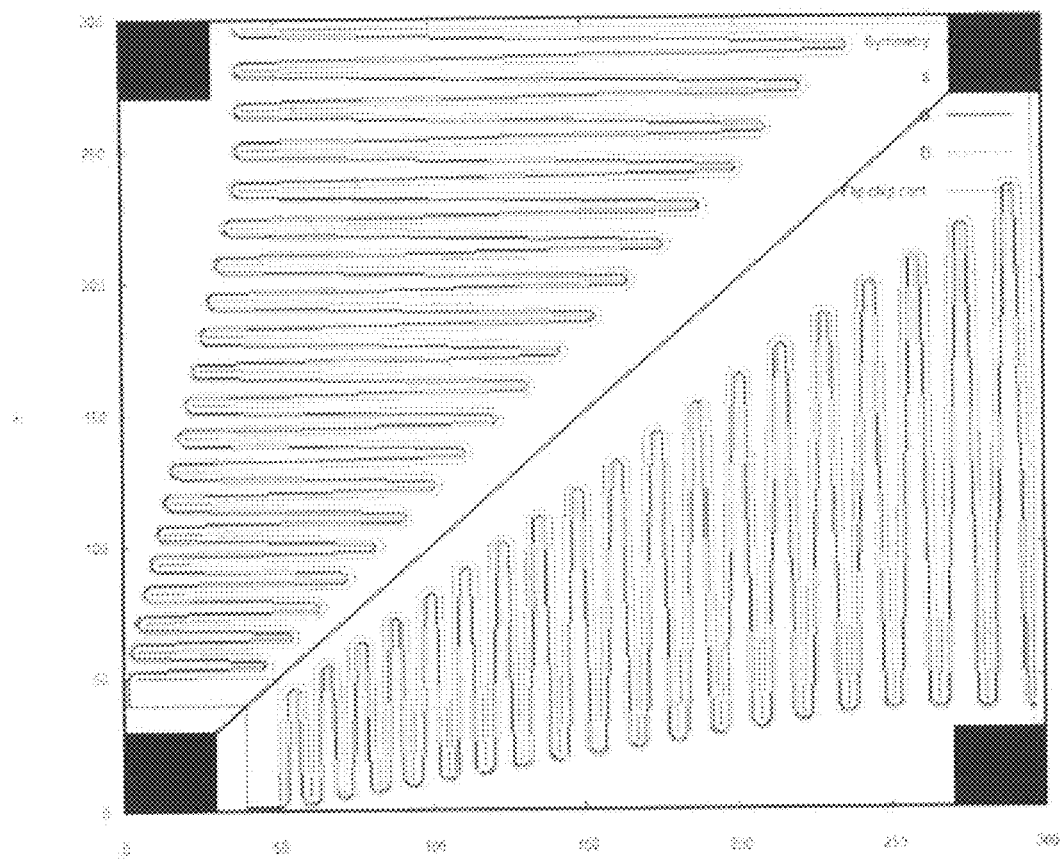
FIG. 13 is a diagram of a device with two triangular areas of interdigitated electrodes, according to an embodiment of the invention.
Figure 14:
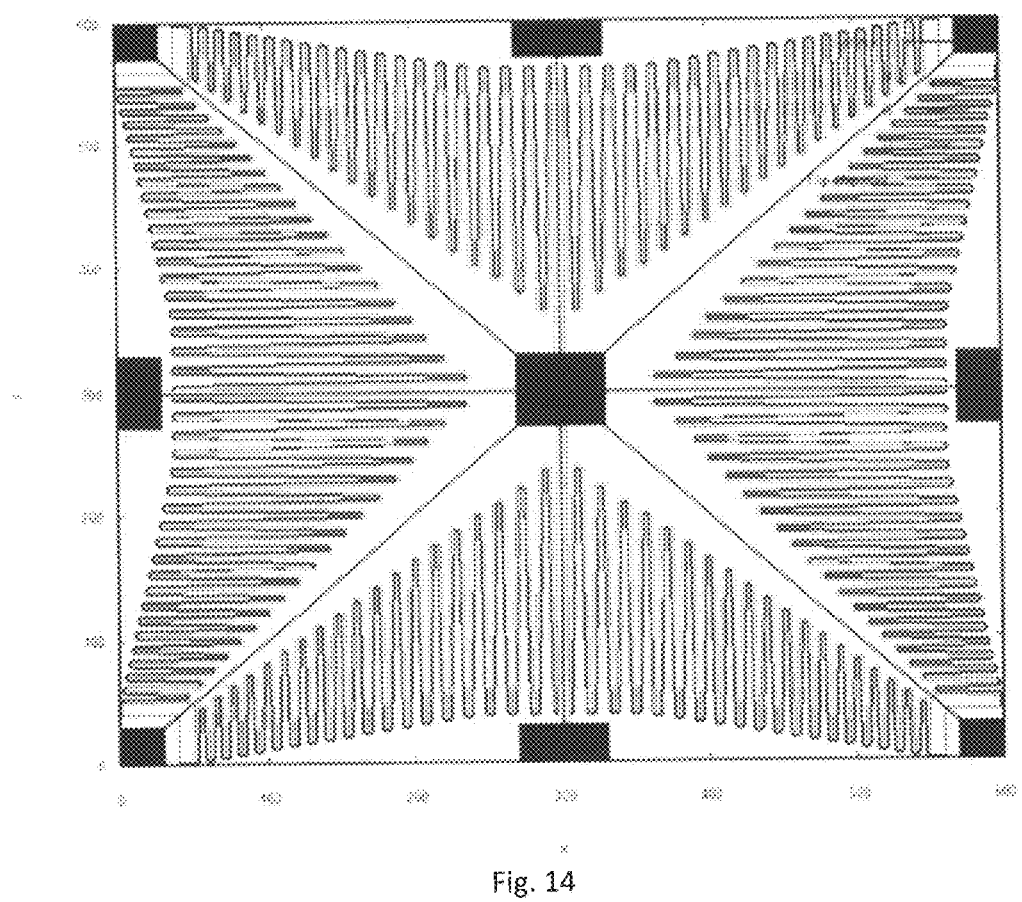
FIG. 14 is a diagram of a device with eight triangular areas of interdigitated electrodes, according to an embodiment of the invention.

Variable base width electrodes with asymmetric fingers as described herein can be used as building blocks for larger devices with high current ratings. For example, using a right angle triangle as the bounding box of the electrode pairs, larger rectangular layout areas can share fewer wire bonds and thus the current rating of a single device may be increased significantly. Two such examples are shown in FIGS. 13 and 14.

EQUIVALENTS

Those skilled in the art will recognize or be able to ascertain variants of the embodiments described herein. Such variants are within the scope of the invention and are covered by the appended claims.

REFERENCES

[1] Xing, J., et al. "Highly sensitive fast-response UV photodetectors based on epitaxial TiO2 films", *Journal of Physics D: Applied Physics,* 44: 375104 (5 pp), 2011.

[2] BenMoussa, A., et al., "Recent developments of wide-bandgap semiconductor based UV sensors", *Diamond and Related Materials,* 18: 860-864, 2009.

[3] U.S. Pat. No. 7,520,173 B2, Interdigitated electrode for electronic device and electronic device using the same.

[4] Yang, C.-W., et al., "Micromachined p-GaN gate normally off power HEMT with an optimized air-bridge matrix layout design", *Digests of CSMANTECH* 2015, paper 17.4.

[5] U.S. Pat. No. 7,417,257 B2, III-nitride device with improved layout geometry.

The invention claimed is:

1. A semiconductor device, comprising:
   at least two electrodes, each of said at least two electrodes comprising an electrode base having a continuously tapered side;
   a plurality of asymmetrical fingers extending from the continuously tapered side of each of said at least two electrodes;
   wherein each asymmetrical finger is asymmetrical about its longitudinal axis;
   wherein the asymmetrical fingers of the at least two electrodes are interdigitated;
   a semiconductor channel between the interdigitated asymmetrical fingers of the at least two electrodes;
   wherein each asymmetrical finger has a smooth shape without angular corners.

2. The semiconductor device of claim 1, wherein a finger tip of each asymmetrical finger has a circular shape.

3. The semiconductor device of claim 1, wherein a finger tip of each asymmetrical finger has an oval shape.

4. The semiconductor device of claim 1, wherein a finger tip of each asymmetrical finger has a shape defined by a power function, wherein the power is two or greater than two.

5. The semiconductor device of claim 1, wherein the continuously tapered side of each electrode base is tapered according to a selected angle;
   wherein a width of each electrode base varies linearly according to the selected angle.

6. The semiconductor device of claim 5, wherein a shape each electrode base is substantially a right-angle triangle.

7. The semiconductor device of claim 6, wherein each electrode base comprises a bounding box of right-angle triangle with bonding pads at two or three corners.

8. The semiconductor device of claim 1, wherein the continuously tapered side of each electrode base is tapered according to a mathematical function;

wherein a width of each electrode base varies non-linearly according to the mathematical function.

9. The semiconductor device of claim 1, wherein the continuously tapered side of each electrode base is tapered according to ratio (GR) between remaining current flow and current flow to a next asymmetrical electrode finger.

10. The semiconductor device of claim 1, wherein the continuously tapered side of each electrode base provides current density uniformity across the plurality of asymmetrical fingers.

11. The semiconductor device of claim 1, further comprising a control electrode coupled to the semiconductor channel between the interdigitated asymmetrical fingers;
wherein the control electrode is operable to interrupt or complete the semiconductor channel.

12. The semiconductor device of claim 1, wherein the continuously tapered side of a first electrode base is tapered at a different angle from the continuously tapered side of a second electrode base.

13. The semiconductor device of claim 1, wherein the continuously tapered side of a first electrode base is tapered at the same angle as the continuously tapered side of a second electrode base.

14. A method for implementing a semiconductor device comprising:
providing each of at least two electrodes of the semiconductor device with an electrode base having a continuously tapered side;
providing a plurality of asymmetrical fingers extending from the continuously tapered side of each electrode base, wherein each asymmetrical finger is asymmetrical about its longitudinal axis;
wherein the asymmetrical fingers of the at least two electrodes are interdigitated;
providing a semiconductor channel between the interdigitated asymmetrical fingers of the at least two electrodes;
wherein each asymmetrical finger has a smooth shape without angular corners.

15. The method of claim 14, comprising implementing a finger tip of each asymmetrical finger with a circular shape.

16. The method of claim 14, comprising implementing a finger tip of each asymmetrical finger with an oval shape.

17. The method of claim 14, comprising implementing a finger tip of each asymmetrical finger with a shape defined by a power function, wherein the power is two or greater than two.

18. The method of claim 14, wherein the continuously tapered side of each electrode base is tapered according to a selected angle;
wherein a width of each electrode base varies linearly according to the selected angle.

19. The method of claim 14, wherein the continuously tapered side of each electrode base is tapered according to a mathematical function;
wherein a width of the electrode base varies non-linearly according to the mathematical function.

20. The method of claim 14, wherein the continuously tapered side of each electrode base is tapered according to a flow ratio (GR) between remaining current flow and current flow to a next asymmetrical finger.

21. The method of claim 14, wherein the continuously tapered side of each electrode base provides current density uniformity across the plurality of asymmetrical fingers.

22. The method of claim 14, further comprising coupling a control electrode to the semiconductor channel between the interdigitated asymmetrical fingers of the electrodes;
wherein the control electrode is operable to interrupt or complete the semiconductor channel.

23. The method of claim 14, wherein the continuously tapered side of a first electrode base is tapered at a different angle from the continuously tapered side of a second electrode base.

24. The method of claim 14, wherein the continuously tapered side of a first electrode base is tapered at the same angle as the continuously tapered side of a second electrode base.

* * * * *